(12) United States Patent
Steinbrecher et al.

(10) Patent No.: US 11,201,600 B1
(45) Date of Patent: Dec. 14, 2021

(54) APPARATUS AND METHODS FOR CONTROL AND CALIBRATION OF TUNABLE FILTERS

(71) Applicant: Analog Devices, Inc., Norwood, MA (US)

(72) Inventors: Christoph M. Steinbrecher, Pennington, NJ (US); Ekrem Oran, Hollis, NH (US); Xizhen Xu, Belle Mead, NJ (US); Christopher Mayer, Dover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/948,887

(22) Filed: Oct. 5, 2020

(51) Int. Cl.
*H03H 7/12* (2006.01)

(52) U.S. Cl.
CPC ......... *H03H 7/12* (2013.01); *H03H 2210/012* (2013.01); *H03H 2210/025* (2013.01); *H03H 2210/04* (2013.01)

(58) Field of Classification Search
CPC ...... H03H 7/12; H03H 11/12; H03H 11/1208; H03G 3/3052; H03G 3/3078
See application file for complete search history.

(56) References Cited

U.S. PATENT DOCUMENTS

| | | | |
|---|---|---|---|
| 5,136,267 A * | 8/1992 | Cabot | H03H 7/12 333/167 |
| 5,227,746 A | 7/1993 | Esaki et al. | |
| 5,235,294 A | 8/1993 | Ishikawa et al. | |
| 5,541,558 A | 7/1996 | Weber et al. | |
| 5,708,448 A | 1/1998 | Wallace | |
| 5,917,387 A | 6/1999 | Rice et al. | |
| 6,091,310 A | 7/2000 | Utsami et al. | |
| 6,160,571 A | 12/2000 | Wang | |
| 6,317,006 B1 | 11/2001 | Welland et al. | |

(Continued)

FOREIGN PATENT DOCUMENTS

| | | |
|---|---|---|
| CN | 1663122 A | 8/2005 |
| EP | 0779707 B1 | 7/2002 |

(Continued)

OTHER PUBLICATIONS

Davis et al., "Integrated RF Architectures in Fully-Organic SOP Technology," IEEE Transactions on Advanced Packaging, vol. 25, No. 2, May 2002, in 7 pages.

(Continued)

*Primary Examiner* — Hai L Nguyen
(74) *Attorney, Agent, or Firm* — Knobbe, Martens, Olson & Bear, LLP

(57) ABSTRACT

Apparatus and methods for control and calibration of tunable filters are provided. In certain embodiments, a tunable filter includes at least one controllable component (for instance, a controllable inductor or a controllable capacitor) having a value that changes or adjusts a center frequency of the tunable filter. For example, the controllable component can correspond to a controllable inductor or a controllable capacitor of an inductor-capacitor (LC) resonator of the tunable filter. The tunable filter further includes a control circuit implemented with an approximation function for estimating a value of the controllable component for achieving a desired center frequency indicated by a frequency control signal.

20 Claims, 12 Drawing Sheets

(56) References Cited

U.S. PATENT DOCUMENTS

| | | |
|---|---|---|
| 6,356,135 B1 | 3/2002 | Rastegar |
| 6,399,997 B1 | 6/2002 | Lin et al. |
| 6,418,030 B1 | 7/2002 | Yamaguchi et al. |
| 6,784,766 B2 | 8/2004 | Allison et al. |
| 6,815,739 B2 | 11/2004 | Huff et al. |
| 6,869,870 B2 | 3/2005 | Lin |
| 6,872,962 B1 | 3/2005 | Barratt |
| 7,127,217 B2 | 10/2006 | Tuttle et al. |
| 7,259,643 B2 | 8/2007 | Son et al. |
| 7,327,406 B2 | 2/2008 | Utsunomiya et al. |
| 7,531,417 B2 | 5/2009 | Lin |
| 7,592,250 B2 | 9/2009 | Shimada et al. |
| 7,638,364 B2 | 12/2009 | Kwon et al. |
| 7,843,702 B2 | 11/2010 | Choi et al. |
| 8,089,155 B2 | 1/2012 | Lin |
| 8,106,479 B1 | 1/2012 | Nathawad |
| 8,129,265 B2 | 3/2012 | Lin |
| 8,134,425 B2 | 3/2012 | Rofougaran et al. |
| 8,150,362 B2 | 4/2012 | Waight et al. |
| 8,187,944 B2 | 5/2012 | Nathawad |
| 8,400,307 B2 | 3/2013 | Kataya et al. |
| 8,482,107 B2 | 7/2013 | Matsumoto et al. |
| 8,810,331 B2 | 8/2014 | Gu et al. |
| 8,918,070 B2 | 12/2014 | Shanan |
| 8,971,218 B2 | 3/2015 | Shor et al. |
| 8,987,061 B2 | 3/2015 | Lee et al. |
| 9,024,700 B2 | 5/2015 | Ranta |
| 9,166,564 B2 | 10/2015 | Koechlin |
| 9,190,201 B2 | 11/2015 | Li et al. |
| 9,219,512 B2 | 12/2015 | Khoini-Poorfard et al. |
| 9,438,196 B2 | 9/2016 | Smith et al. |
| 9,449,749 B2 | 9/2016 | Gupta et al. |
| 9,484,879 B2 | 11/2016 | Scott et al. |
| 9,543,892 B1 | 1/2017 | Farazian |
| 9,673,155 B2 | 6/2017 | Smith et al. |
| 9,712,140 B1 | 7/2017 | Salvi et al. |
| 9,735,752 B2 | 8/2017 | Mohsin et al. |
| 9,755,029 B1 | 9/2017 | Goktepeli |
| 9,906,318 B2 | 2/2018 | Zuo |
| 9,907,114 B2 | 2/2018 | Sahota |
| 9,990,089 B2 | 6/2018 | Dickinson |
| 10,002,838 B2 | 6/2018 | Goktepeli |
| 10,074,942 B2 | 9/2018 | Goktepeli |
| 10,095,907 B2 | 10/2018 | Hinger |
| 10,103,135 B2 | 10/2018 | Zuo et al. |
| 10,236,573 B2 | 3/2019 | Cheng et al. |
| 10,236,855 B2 | 3/2019 | Schmidhammer |
| 10,254,901 B2 | 4/2019 | Dickinson et al. |
| 10,382,031 B2 | 8/2019 | Ranta |
| 10,431,558 B2 | 10/2019 | Goktepeli |
| 10,432,152 B2 | 10/2019 | Watts et al. |
| 10,446,898 B2 | 10/2019 | Cheng et al. |
| 10,461,695 B2 | 10/2019 | Liu et al. |
| 10,720,947 B1 | 7/2020 | Regadamilli et al. |
| 2003/0222295 A1 | 12/2003 | Lin |
| 2006/0194558 A1 | 8/2006 | Kelly |
| 2007/0108551 A1 | 5/2007 | Lin |
| 2007/0182521 A1 | 8/2007 | Lin |
| 2007/0202684 A1 | 8/2007 | Lin |
| 2007/0202685 A1 | 8/2007 | Lin |
| 2009/0027141 A1 | 1/2009 | Oshimi |
| 2009/0033439 A1 | 2/2009 | Igarashi |
| 2014/0264732 A1 | 9/2014 | Elsherbini et al. |
| 2016/0344370 A1* | 11/2016 | Tani ............. H03H 7/075 |
| 2016/0359466 A1 | 12/2016 | Schmidhammer |
| 2017/0244376 A1 | 8/2017 | Morris et al. |
| 2018/0090475 A1 | 3/2018 | Zuo et al. |
| 2020/0059217 A1 | 2/2020 | Masse et al. |
| 2020/0279087 A1 | 9/2020 | Seo et al. |

FOREIGN PATENT DOCUMENTS

| | | |
|---|---|---|
| JP | H10246775 A | 9/1998 |
| JP | 5041154 B2 | 10/2012 |
| KR | 101133144 B1 | 4/2012 |
| KR | 101296544 B1 | 8/2013 |
| WO | WO 2019/132925 A1 | 7/2019 |

OTHER PUBLICATIONS

Gee et al., "Highly-Selective Tunable Bandpass Filter With Two-Path Mixed Coupling" IEEE Microwave and Wireless Components Letters, vol. 24, No. 7 dated Jul. 2014, in 3 pages.

Mohieldin et al., "A 2.7-V 1.8-GHz Fourth-Order Tunable LC Bandpass Filter Based on Emulation of Magnetically Coupled Resonators" dated Jul. 2003, in 11 pages.

New Edge Signal Solutions, SAX239R2—[30520]MHz Tunable Bandpass Filter dated Jul. 2020, in 5 pages.

Streeter et al., "VHF High-Power Tunable RF Bandpass Filter Using Microelectromechanical MEM Microrelays" dated Mar. 30, 2001, in 15 pages.

Zahirovic "Tunable Filters and RF MEMS Variable Capacitors with Closed Loop Control" A thesis presented to the University of Waterloo in fulfillment of the thesis requirement for the degree of Doctor of Philosophy in Electrical and Computer Engineering dated 2011 in 153 pages.

* cited by examiner

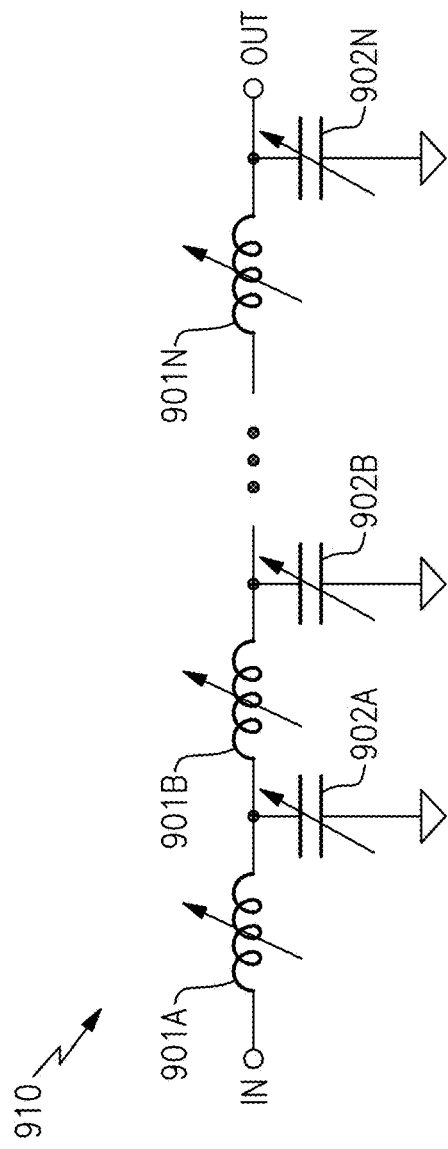
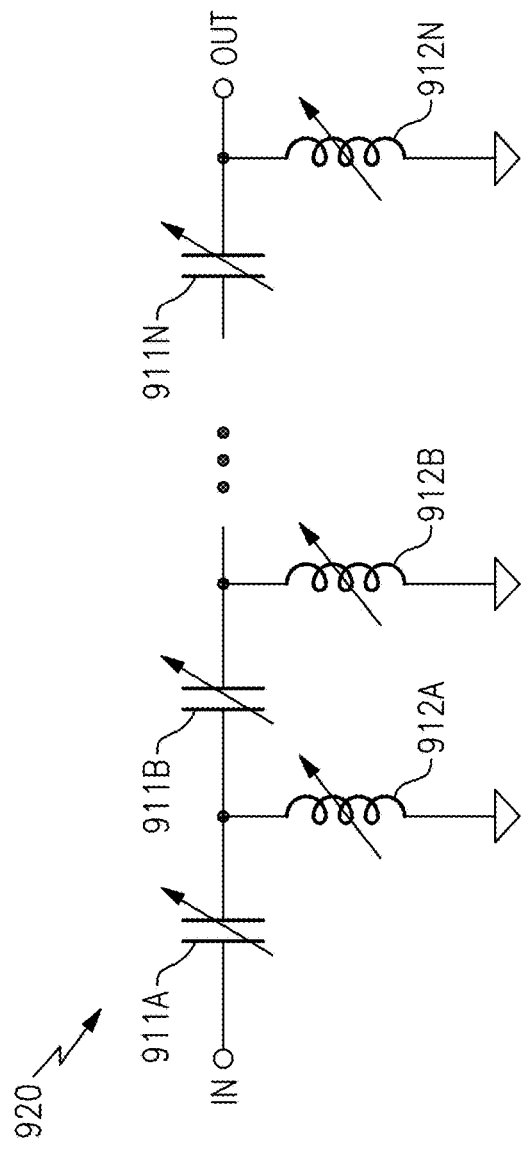

APPARATUS AND METHODS FOR CONTROL AND CALIBRATION OF TUNABLE FILTERS

FIELD OF THE DISCLOSURE

Embodiments of the invention relate to electronic systems, and more particularly, to tunable filters for radio frequency electronics.

BACKGROUND

Electronic systems can use tunable filters to adjust the frequencies filtered within a signal chain. Tunable filters can be used in a number of different applications, including, but not limited to, base stations, mobile devices, instrumentation, industrial electronics, military electronics, laptop computers, tablets, professional wideband digital radios, and compact and/or portable instruments. In contrast to fixed filters, tunable filters allow additional flexibility for a given application by providing control over the specific frequencies that are filtered.

SUMMARY OF THE DISCLOSURE

Apparatus and methods for control and calibration of tunable filters are provided. In certain embodiments, a tunable filter includes at least one controllable component (for instance, a controllable inductor or a controllable capacitor) having a value that changes or adjusts a center frequency of the tunable filter. For example, the controllable component can correspond to a controllable inductor or a controllable capacitor of an inductor-capacitor (LC) resonator of the tunable filter. The tunable filter further includes a control circuit implemented with an approximation function for estimating a value of the controllable component for achieving a desired center frequency indicated by a frequency control signal. Thus, rather than using a look-up table (LUT) to look up the exact controllable component value corresponding to a given value of the desired center frequency, the control circuit uses the approximation function to estimate the controllable component value to achieve the desired center frequency. Using an approximation function rather than a LUT can provide a number of advantages, including reduced chip layout area and faster calibration time. For example, although the points or coefficients of the approximation function can be programmed to provide calibration, only a small range of calibration codes need to be exercised around a nominal point (for instance, obtained from simulation) rather than searching all possible code values.

In one aspect, a tunable filter system includes a tunable filter configured to receive a radio frequency (RF) signal and to output a filtered RF signal, the tunable filter including an LC resonator having a first controllable component, wherein a center frequency of the tunable filter changes based on a value of the first controllable component. The tunable filter system further includes a control circuit configured to set the value of the first controllable component of the LC resonator based on an estimated value obtained from an approximation function of the center frequency.

In another aspect, a method of tunable filtering is provided. The method includes filtering an RF signal to generate a filtered RF signal using a tunable filter, controlling a center frequency of the tunable filter using a first controllable component of an LC resonator of the tunable filter, estimating a value of the first controllable component using an approximation function of the center frequency, and setting the first controllable component of the LC resonator to the estimated value using a control circuit.

In another aspect, a tunable filter system is provided. The tunable filter system includes a tunable filter configured to receive an RF signal and to output a filtered RF signal, the tunable filter including an LC resonator having a first controllable component, wherein a center frequency of the tunable filter changes based on a value of the first controllable component. The tunable filter system further includes a control circuit configured to set the value of the first controllable component of the LC resonator, wherein the control circuit includes means for estimating the value of the first controllable component by an approximation function of the center frequency.

BRIEF DESCRIPTION OF THE DRAWINGS

FIG. 8A is a schematic diagram of a tunable filter according to one embodiment.

FIG. 8B is a schematic diagram of a tunable filter according to another embodiment.

DETAILED DESCRIPTION OF EMBODIMENTS

Figure 1:
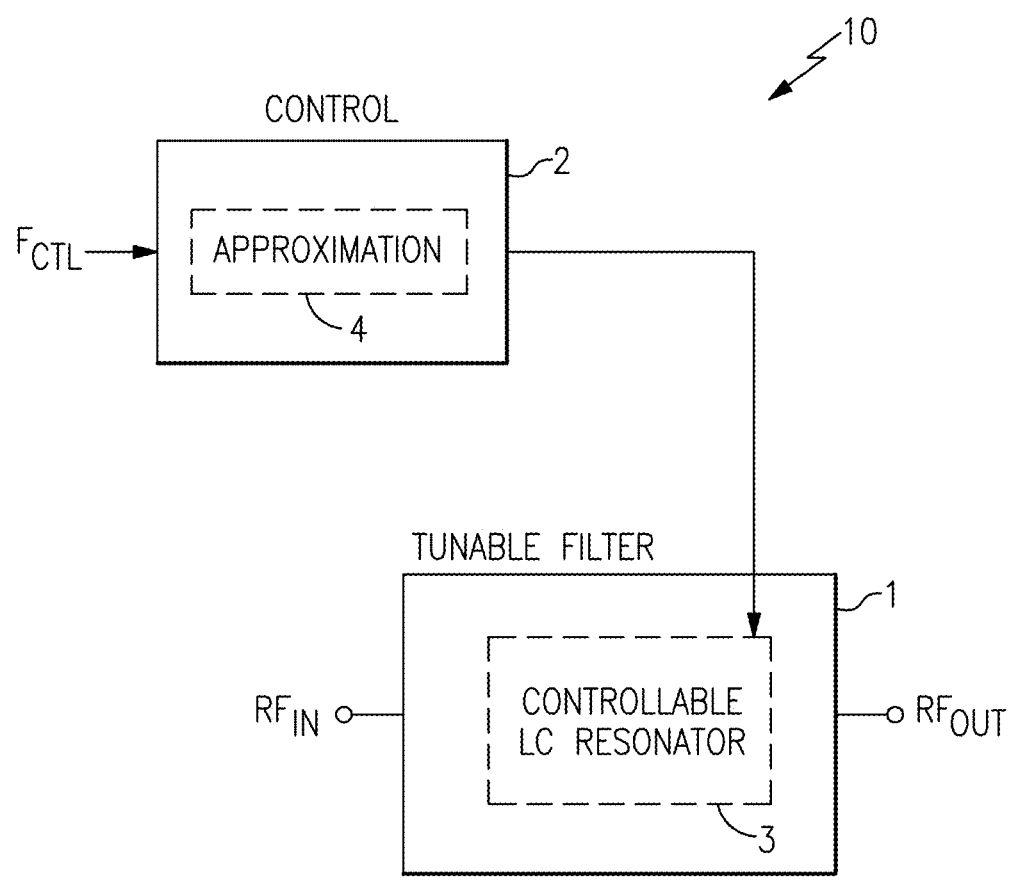
FIG. 1 is a schematic diagram of a tunable filter system according to one embodiment.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Tunable filters can be used in a wide variety of applications for filtering the frequency content of RF signals. For example, in a wireless communication system, tunable filters can be implemented with a bandpass frequency response to limit the frequency content of an RF signal to a particular frequency range or band. Such tunable filters can be used in transmit and/or receive paths of the wireless communication system. Tunable filters provide additional flexibility versus fixed filters.

Provided herein are apparatus and methods for control and calibration of tunable filters. In certain embodiments, a tunable filter includes at least one controllable component (for instance, a controllable inductor or a controllable capacitor) having a value that changes or adjusts a center frequency of the tunable filter. For example, the controllable component can correspond to a controllable inductor or a controllable capacitor of an inductor-capacitor (LC) resonator of the tunable filter. The tunable filter further includes a control circuit implemented with an approximation function for estimating a value of the controllable component for achieving a desired center frequency indicated by a frequency control signal. Thus, rather than using a look-up table (LUT) to look up the exact controllable component value corresponding to a given value of the desired center frequency, the control circuit uses the approximation function to estimate the controllable component value to achieve the desired center frequency.

Using an approximation function rather than a LUT can provide a number of advantages, including reduced chip layout area and faster calibration time. For example, although the points or coefficients of the approximation function can be programmed to provide calibration, only a small range of calibration codes need to be exercised around a nominal point (for instance, obtained from simulation) rather than searching all possible code values.

The approximation function can be implemented in a variety of ways. In certain implementations, the approximation function can correspond to a piece-wise linear function or a polynomial function used to estimate the controllable component value needed for the controllable component to achieve the desired center frequency indicated by the frequency control signal.

In certain implementations, the tunable filter includes one or more additional controllable components used to adjust other frequency characteristics of the tunable filter, such as bandwidth, impedance matching, corner frequency, and/or notch frequency. Rather than using a LUT for setting these additional controllable components values, another approximation function is used in which the input corresponds to the chosen controllable component value used to set the desired center frequency. Thus, the component values for these additional controllable components are chosen based on the estimated component value used for achieving the desired center frequency.

The tunable filters herein can provide filtering to RF signals of a variety of signal frequencies, including not only RF signals between 30 megahertz (MHz) and 7 gigahertz (GHz), but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave systems.

FIG. 1 is a schematic diagram of a tunable filter system 10 according to one embodiment. The tunable filter system 10 includes a tunable filter 1 and a control circuit 2.

As shown in FIG. 1, the tunable filter 1 receives an RF signal from an RF input $RF_{IN}$ and provides a filtered RF signal to an RF output $RF_{OUT}$. In certain implementations, the tunable filter system 10 is fabricated on a semiconductor die (also referred to herein as a semiconductor chip), and the RF input $RF_{IN}$ and the RF output $RF_{OUT}$ correspond to pins of the semiconductor die.

The tunable filter 1 includes at least one controllable LC resonator 3 that has one or more component values set by the control circuit 2. Although shown as controlling component value(s) of the controllable LC resonator 3, the control circuit 2 can also control the tunable filter 1 in other ways, such as setting the component value of one or more bandwidth adjustment components, notch frequency components, corner frequency components, and/or matching components.

A wide range of controllable components can be included in the tunable filter 1. In one example, the tunable filter 1 includes a controllable capacitor, which can be implemented in a wide variety of ways. For instance, a controllable capacitor can be implemented using a bank of selectable capacitor cells, a diode varactor, a p-i-n diode capacitor, a microelectromechanical systems (MEMS) capacitor, and/or any other structure with controllable capacitance. In another example, the tunable filter 1 includes a controllable inductor, such as a bank of selectable inductor cells, an inductor having a changeable length using a switch, and/or any other structure with controllable inductance. Although various examples of tuning are provided, the teachings herein are applicable to a wide variety of implementations of controllable components.

In the illustrated embodiment, the control circuit 2 receives a frequency control signal $F_{CTL}$ indicating a desired center frequency for the tunable filter 1. In certain implementations, the control signal $F_{CTL}$ is received over a bus of a semiconductor chip, for instance, a serial interface.

As shown in FIG. 1, the control circuit 2 is implemented with an approximation function 4 for estimating the value of one or more controllable components of the tunable filter 1 to achieve the desired center frequency. Thus, rather than using a LUT to map the indicated center frequency to corresponding component values of the tunable filter 1, the control circuit 2 uses the approximation function 4. In certain implementations, the approximation function is implemented using digital logic gates and memory of the control circuit 2.

By implementing the control circuit 2 with the approximation function 4, reduced chip area and faster calibration time is realized. For example, when using a large LUT for mapping, generally if the filter is tunable to M center frequencies and the filter contains N tunable elements each controlled by k bits, the LUT size is about M*N*k. Moreover, the dimension of such a LUT is further expanded for each bandwidth supported. Furthermore, without knowledge of the dependencies between the tunable elements, all possible tunable codes ($N*2^k$) need to be searched to determine the calibrated code for each of the M center frequencies.

In contrast, using the approximation function 4 provides both area efficiency and fast calibration time. The points of the approximation function 4 are programmable during calibration, but only a small range of codes around a nominal point (as opposed to the full range of all codes) are needed to be searched to achieve reduced calibration time. The points of the approximation function 4 are also referred to herein as coefficients or parameters.

Figure 2A:
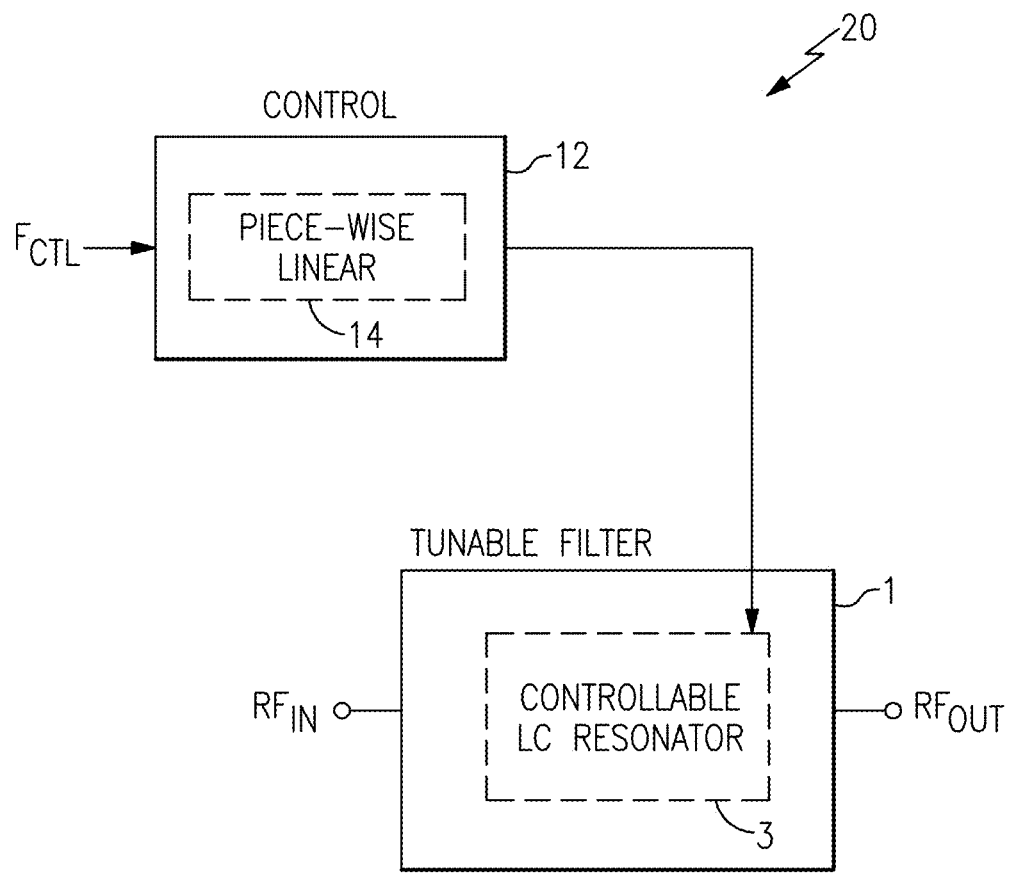
FIG. 2A is a schematic diagram of a tunable filter system according to another embodiment.

FIG. 2A is a schematic diagram of a tunable filter system 20 according to another embodiment. The tunable filter system 20 includes a tunable filter 1 and a control circuit 12.

The tunable filter system 20 of FIG. 2A is similar to the tunable filter system 10 of FIG. 1, except that the tunable filter system 20 of FIG. 2A is implemented with a specific approximation function. In particular, the control circuit 12 of FIG. 2A is implemented with a piece-wise linear function 14 for setting one or more controllable component values of the tunable filter 1 based on a desired center frequency indicated by the frequency control signal $F_{CTL}$. The piece-wise linear function 14 can have any suitable number of linear sections, for instance, two or more.

Figure 2B:
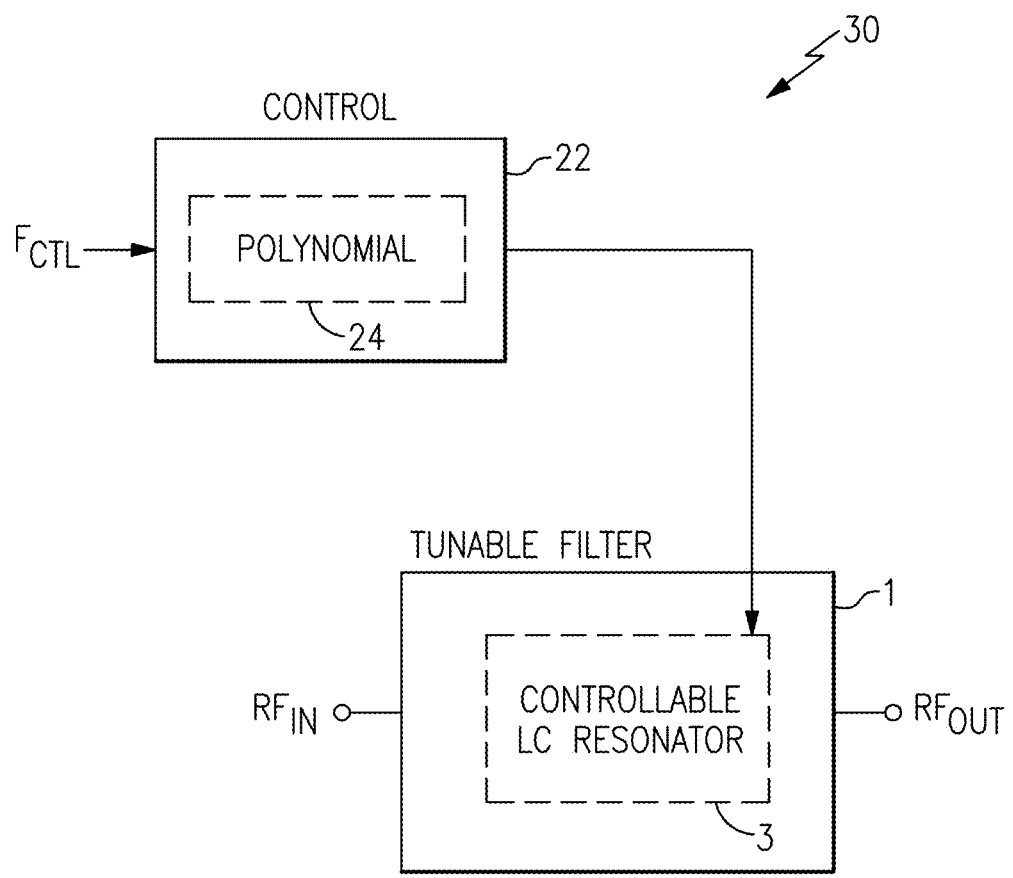
FIG. 2B is a schematic diagram of a tunable filter system according to another embodiment.

FIG. 2B is a schematic diagram of a tunable filter system 30 according to another embodiment. The tunable filter system 30 includes a tunable filter 1 and a control circuit 22.

The tunable filter system 30 of FIG. 2B is similar to the tunable filter system 10 of FIG. 1, except that the tunable filter system 30 of FIG. 2B is implemented with a specific approximation function. In particular, the control circuit 22 of FIG. 2B is implemented with a polynomial function 24 for setting one or more controllable component values of the tunable filter 1 based on a desired center frequency indicated by the frequency control signal $F_{CTL}$. The polynomial function 24 can have any suitable order, for instance, second order or higher.

Figure 3:
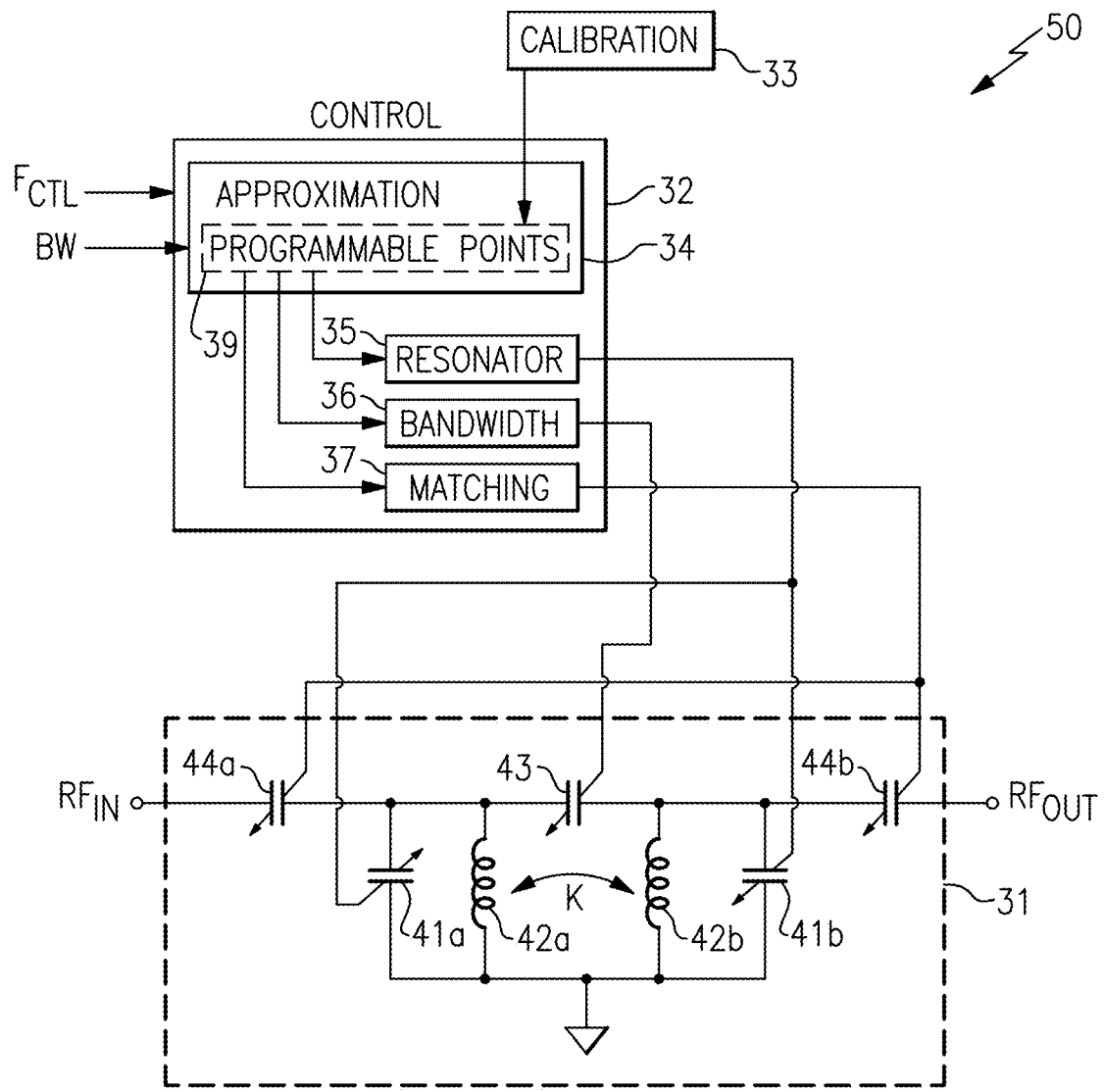
FIG. 3 is a schematic diagram of a tunable filter system according to another embodiment.

FIG. 3 is a schematic diagram of a tunable filter system 50 according to another embodiment. The tunable filter system 50 includes a tunable filter 31, a control circuit 32, and a calibration circuit 33.

In the illustrated embodiment, the tunable filter 31 includes a controllable input matching capacitor 44a, a controllable bandwidth capacitor 43, and a controllable output matching capacitor 44b electrically connected in series between an RF input $RF_{IN}$ and an RF output $RF_{OUT}$. Additionally, the tunable filter 31 further includes a first controllable resonator capacitor 41a and a first resonator inductor 42a electrically connected in parallel with one another between a first end of the controllable bandwidth capacitor 43 and ground. Furthermore, the tunable filter 31 further includes a second controllable resonator capacitor 41b and a second resonator inductor 42b electrically connected in parallel with one another between a second end of the controllable bandwidth capacitor 43 and ground. The first resonator inductor 42a and the second resonator inductor 42b are coupled with coupling factor k, thereby providing a coupled resonator structure, in this embodiment.

Although one example of a tunable filter is depicted, the teachings herein are applicable to tunable filters implemented in a wide variety of ways. Accordingly, other implementations are possible.

The control circuit 32 is implemented with an approximation function 34 that operates based on a set of programmable points stored in a memory 39, which can be volatile or non-volatile. The control circuit 32 operates based on a desired center frequency indicated by a frequency control signal $F_{CTL}$ and a desired bandwidth indicated by a bandwidth control signal BW. In certain implementations, the memory 39 stores a different set of programmable points for each value of the bandwidth control signal BW.

With continuing reference to FIG. 3, the approximation function 34 is used to set code values in a resonator register 35, a bandwidth register 36, and a matching register 37. As shown in FIG. 3, the codes value in the resonator register 35 controls the capacitance values of the first controllable resonator capacitor 41a and the second controllable resonator capacitor 41b. Additionally, the code value in the bandwidth register 36 controls the capacitance value of the controllable bandwidth capacitor 43, while the code value in the matching register 37 controls the capacitance values of the controllable input matching capacitor 44a and the controllable output matching capacitor 44b.

As shown in FIG. 3, the calibration circuit 33 is operable to adjust the values of the programmable points stored in the memory 34. Thus, rather than needing to search through all possible codes for controlling each controllable component, the calibration circuit 33 can adjust the programmable points stored in the memory 34 to provide calibration for variations arising from manufacturing and/or other sources.

In certain implementations, the calibration circuit 33 is coupled to the RF input $RF_{IN}$ and the RF output $RF_{OUT}$ to aid in detecting the performance of the tunable filter 31 for particular values of the programmable points of the approximation function 34. In other implementations, external performance measurement equipment is used to detect the performance of the tunable filter 31 for particular values of the programmable points. Such external performance measurement equipment can operate in combination with the calibration circuit 33 (for instance, by way of communication over a bus) to perform calibration.

Figure 4A:
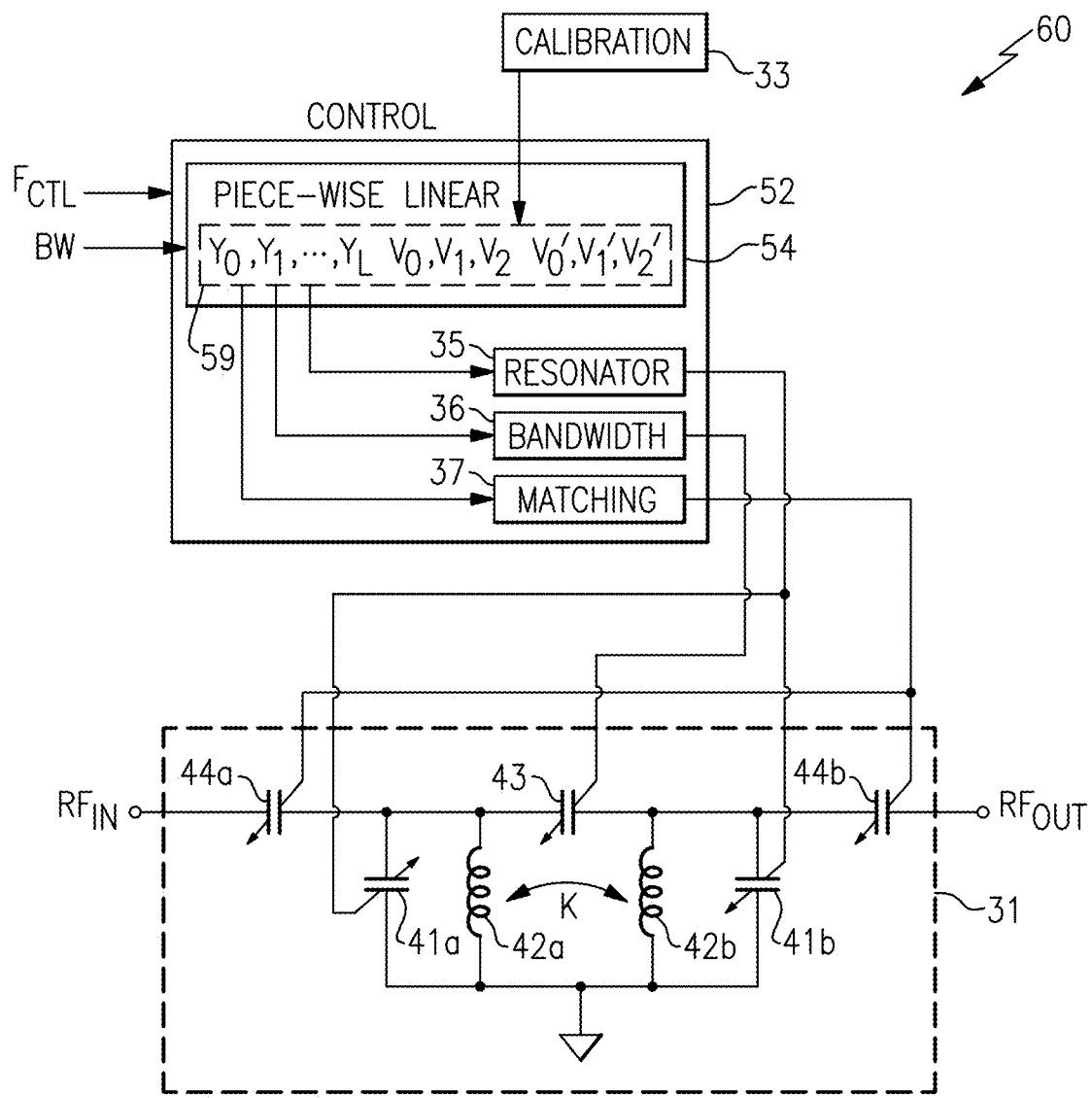
FIG. 4A is a schematic diagram of a tunable filter system according to another embodiment.

FIG. 4A is a schematic diagram of a tunable filter system 60 according to another embodiment. The tunable filter system 60 includes a tunable filter 31, a control circuit 52, and a calibration circuit 33.

The tunable filter system 60 of FIG. 4A is similar to the tunable filter system 50 of FIG. 3, except that the tunable filter system 50 of FIG. 4A is implemented with a specific approximation function. In particular, the control circuit 52 of FIG. 4A is implemented with a piece-wise linear function 54 that operates on points $Y_0, Y_1, \ldots Y_L, V_0, V_1, V_2, V_0', V_1'$, and $V_2'$ stored in memory 59, as will be discussed below. In certain implementations, the different values of the points or a portion of the points are stored for each possible bandwidth setting indicated by the bandwidth control signal BW.

Figure 4B:
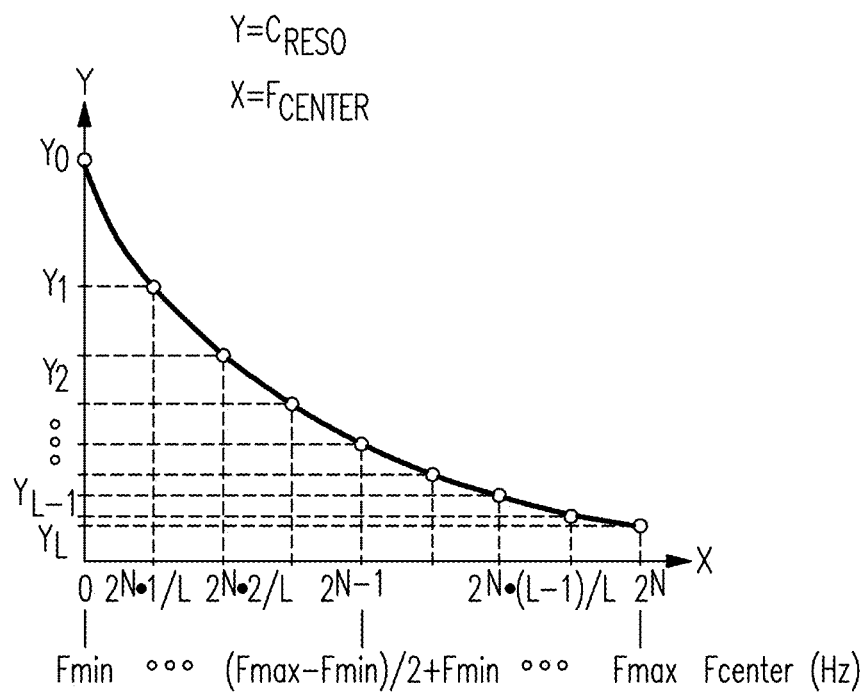
FIG. 4B is a graph of one example of an approximation function for resonator capacitor code versus center frequency code.

FIG. 4B is a graph of one example of an approximation function for resonator capacitor code versus center frequency code. The depicted approximation function serves to generate a code value for a controllable resonator capacitor (for example, capacitors 41a and 41b of the FIG. 4A) for a desired center frequency (for example, as indicated by $F_{CTL}$ in FIG. 4A).

For resonator-based bandpass filters, the impedance of the resonator primarily sets the center frequency of the bandpass frequency. Thus, for the embodiment of FIG. 4A, the resonator capacitance $C_{RESO}$ of the first controllable resonator capacitor 41a and the second controllable resonator capacitor 41b sets the center frequency. For example, center frequency ($F_{CENTER}$) of the tunable filter 4A can be roughly expressed by Equation 1 below.

$$C_{RESO} \propto \frac{1}{F_{CENTER}^2} \qquad \text{Equation 1}$$

With continuing reference to FIG. 4B, the function $C_{RESO}=f(F_{CENTER})$ is approximated by a piecewise linear function dividing the overall curve into L subranges with (L+1) points. The number of points can be chosen to achieve a desired accuracy. In this example, the points of the curve correspond to $(0, Y_0)$, $(2^N*1/L, Y_1)$, $(2^N*2/L, Y_2)$, $(2^N[L-1]/L, Y_{L-1})$, and $(2^N, Y_L)$. In this example, the values of the Y points are programmable during calibration to account for variation.

In the illustrated embodiment, the step size of the x-axis (corresponding to an input code indicating desired center frequency) is chosen as powers of 2 to allow an efficient implementation of division in hardware (for instance, a right bit-shift). However, other implementations are possible. In one example, powers of 2 are used with additional points added for portions of the curve (sub-ranges) that are less linear (for instance, between 0 and $2^N*1/L$ in the depicted graph). In another example, the points are evenly dispersed across the input range. Any suitable step size of the x-axis can be used.

Figure 4C:
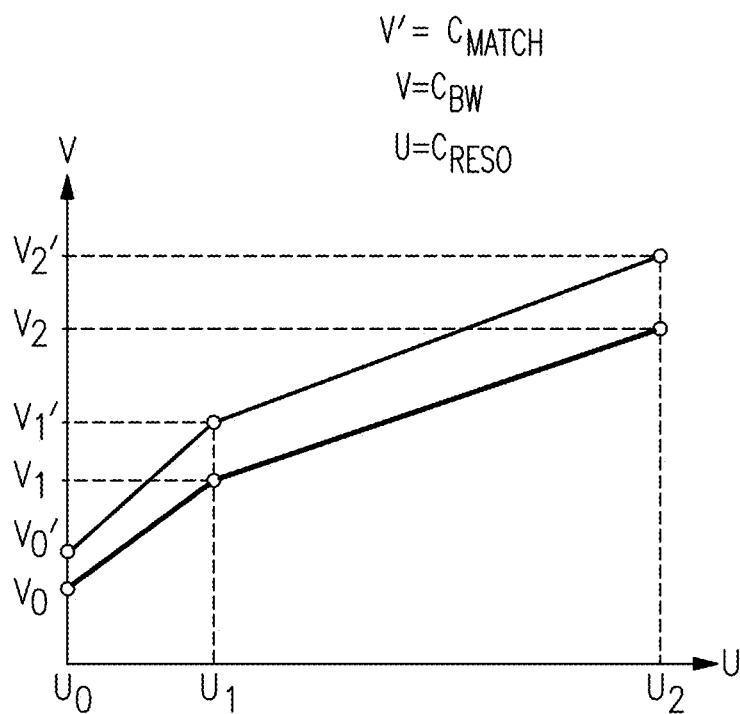
FIG. 4C is a graph of one example of approximation functions of bandwidth capacitor code and matching capacitor code versus resonator capacitor code.

FIG. 4C is a graph of one example of approximation functions of bandwidth capacitor code and matching capacitor code versus resonator capacitor code.

With reference to FIGS. 4A-4C, the code value $C_{BW}$ of the controllable bandwidth capacitor 43 is highly correlated to the code value $C_{RESO}$ of the controllable resonator capacitors 41a and 41b. Additionally, the code value $C_{MATCH}$ of the controllable matching capacitors 44a and 44b is highly correlated to the code value $C_{RESO}$ of the controllable resonator capacitors 41a and 41b.

Accordingly, the code values $C_{BW}$ and $C_{MATCH}$ can be generated based on the value of $C_{RESO}$ obtained from the approximation function of FIG. 4A. For example, a linear relationship (offset and slope) can be used.

At the endpoints, due to circuit parasitics, deviations from the relationship occur. This can be well approximated by changing the slope in the linear function over a sub-range of codes. The example of FIG. 4C depicts a dual-slope linear approximation. In this example, points $(U_0, V_0)$, $(U_1, V_1)$, and $(U_2, V_2)$ are used to approximate $C_{BW}$ based on $C_{RESO}$. Additionally, points $(U_0, V_0')$, $(U_1, V_1')$, and $(U_2, V_2')$ are used to approximate $C_{MATCH}$ based on $C_{RESO}$. However, in general, as many different points as desired can be used for such approximations.

In certain implementations, the slope for each bandwidth setting is different and the points on the function can be reprogrammed or stored separately for each bandwidth setting (as indicated by the bandwidth control signal BW).

Figure 5A:
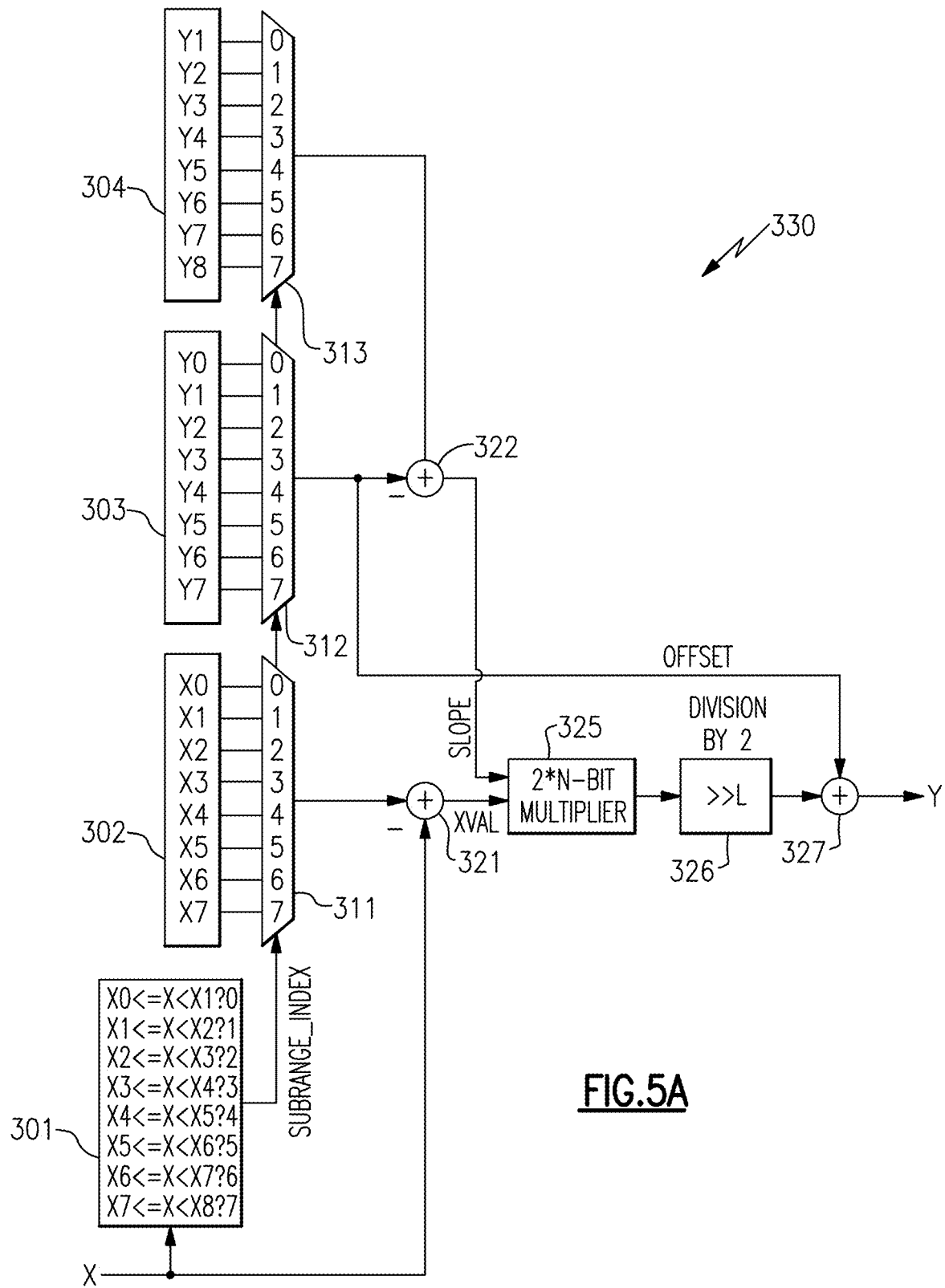
FIG. 5A is a schematic diagram of one embodiment of control circuitry for determining resonator capacitor code based on center frequency code.

FIG. 5A is a schematic diagram of one embodiment of control circuitry 330 for determining resonator capacitor code based on center frequency code.

In the illustrated embodiment, the control circuitry 330 includes a detection circuit 301 for detecting the subrange of an input code X indicating desired center frequency. The control circuitry 330 further includes a first register 302 storing the x-values of the points of the approximation function, a second register 303 storing the y-values of the points of the approximation function, and a third register 304 storing shifted y-values (right-shifted by 1 bit) of the points of the approximation function. Also represented as two different registers for figure clarity, a shared register can be used for storing all y-values.

The control circuitry 330 further includes a first subtractor 321 for generating an XVAL signal based on a difference between the x-values stored in the first register 302 and the input code X. The control circuitry 330 further includes a second subtractor 322 for generating a slope signal (SLOPE) based on a difference between the shifted y-values stored in the third register 304 and the y-values stored in the second register 303. The control circuitry 330 further includes a multiplier 325 for multiplying XVAL and SLOPE, a divider 326 for providing division by 2 to the multiplied result, and an adder 327 for adding the divided result and an offset (OFFSET) indicated by the y-values stored in the third register 304.

By efficiently using the information calculated for each subrange, $C_{RESO}$ can be calculated using only one multiplier. Thus, an efficient hardware implementation can be realized. In certain implementations, the digital circuitry 330 is realized using digital logic circuits and memory.

Figure 5B:
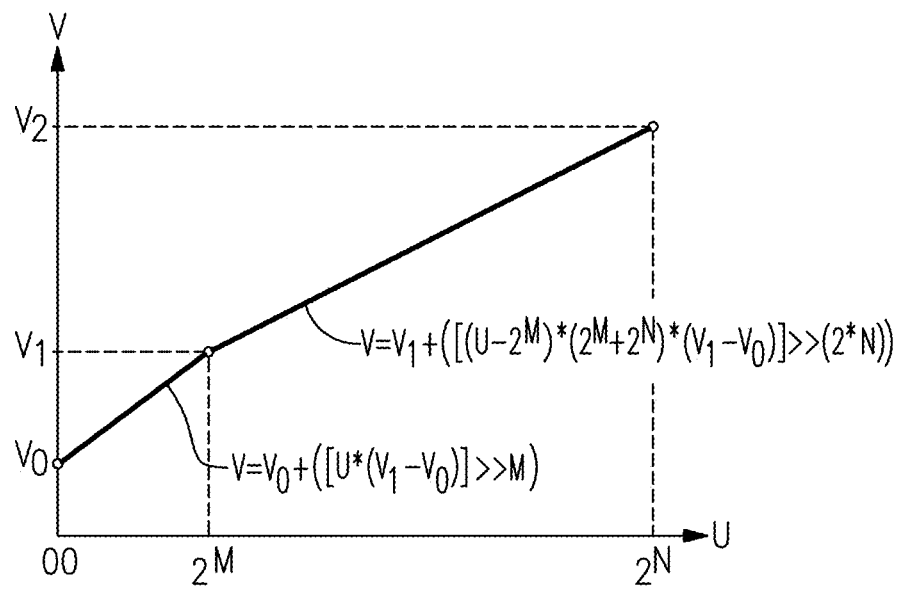
FIG. 5B is a graph of one example of an approximation function for bandwidth or matching capacitor code versus resonator capacitor code.

FIG. 5B is a graph of one example of an approximation function for bandwidth or matching capacitor code versus resonator capacitor code. In certain implementations, the approximation function given by Equation 2 below is used to reduce hardware complexity.

$$\frac{V2-V1}{2^N-2^M} \approx (V2-V1)\frac{2^N+2^M}{2^{2N}} \qquad \text{Equation 2}$$

Thus, for calculating the code values $C_{BW}$ and $C_{MATCH}$, the any-numerator, any-denominator division can be replaced with a multiplication and bit-shift, which is hardware efficient.

Figure 5C:
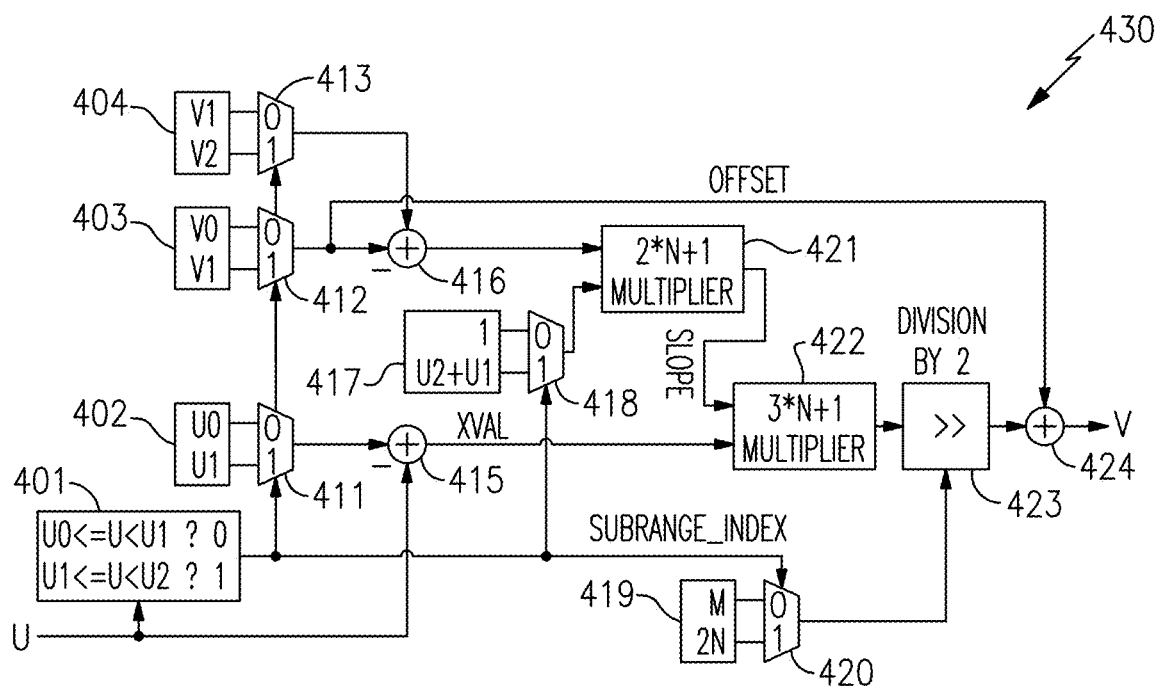
FIG. 5C is a schematic diagram of one embodiment of control circuitry for determining bandwidth or matching capacitor code based on resonator capacitor code in accordance with FIG. 5B.

FIG. 5C is a schematic diagram of one embodiment of control circuitry 430 for determining bandwidth or matching capacitor code based on resonator capacitor code in accordance with FIG. 5B. Two instantiations of the control circuitry 430 can be included for determining both bandwidth and matching capacitor codes. The control circuitry 430 employs Equation 2 above for reduced hardware complexity.

In the illustrated embodiment, the control circuit 430 includes a range detection circuit 401 for the input code U, a first register 402 for u-values, a second register 403 for v-values, a third register 404 for shifted v-values, a first multiplexer 411, a second multiplexer 412, a third multiplexer 413, a first subtractor 415, a second subtractor 416, a fourth register 417, a fourth multiplexer 418, a fifth register 419, a fifth multiplexer 420, a first multiplier 421, a second multiplier 422, a divider 423, and an adder 424.

Figure 6A:
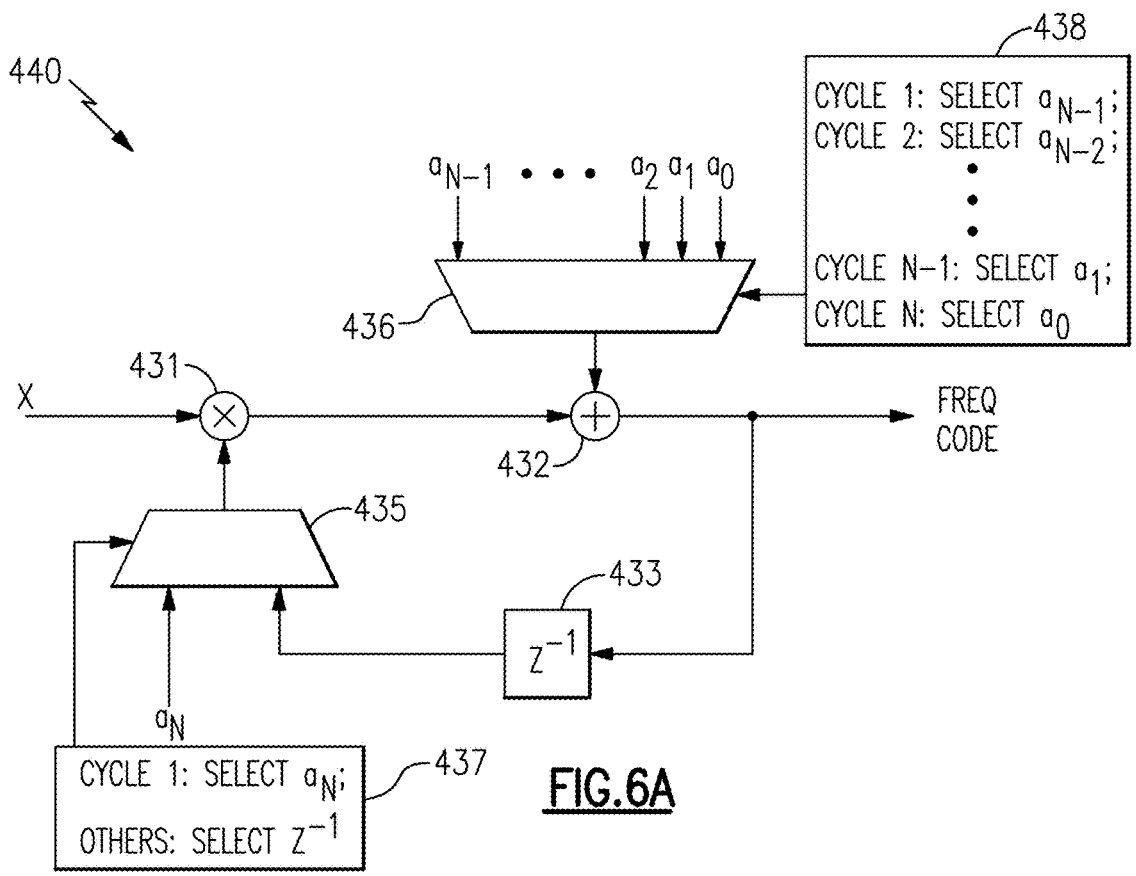
FIG. 6A is a schematic diagram of one embodiment of control circuitry for determining resonator capacitor code based on center frequency code.

FIG. 6A is a schematic diagram of one embodiment of control circuitry 440 for determining resonator capacitor code based on center frequency code.

In certain implementations herein, a polynomial approximation function is used for estimating a frequency characteristic of a tunable filter. For example, a polynomial approximation function of resonator capacitor code versus center frequency code can be used to estimate a particular resonator capacitor code needed to approximately achieve a particular center frequency of the tunable filter. For instance, Equation 3 corresponds to one expression of a polynomial approximation function in which f(x) is the function for obtaining resonator capacitor code, x is center frequency code, N is the order of the polynomial, and $a_i$ are the coefficients of the polynomial approximation function. Any suitable number of coefficients can be used.

$$f(x) = \sum_{i=0}^{N} (a_i x^i) = ((a_N * x + a_{N-1}) * x + a_{N-2}) * x + \ldots + a_0 \qquad \text{Equation 3}$$

The control circuitry 440 of FIG. 6A depicts one example of a hardware efficient implementation of the polynomial approximation function of Equation 3. The control circuitry 440 includes a multiplier 431, an adder 432, memory elements 433 (for instance, latches or flip-flops), a first multiplexer 435, a second multiplexer 436, a first multiplexer control circuit 437, and a second multiplexer control circuit 438. The control circuitry 440 receives a signal X indicating the desired center frequency and generates a resonator capacitor code (FREQ CODE) for approximately achieving the desired center frequency.

Figure 6B:
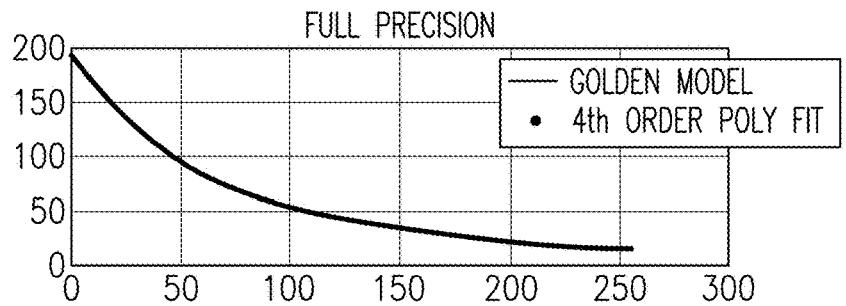
FIG. 6B is a graph of another example of an approximation function for resonator capacitor code versus center frequency code.

FIG. 6B is a graph of another example of an approximation function for resonator capacitor code versus center frequency code. In this example, a fourth order polynomial approximation function (5 coefficients) in accordance with FIG. 6A was used. In this example, full precision approximation was used (no rounding or saturation).

Figure 6C:
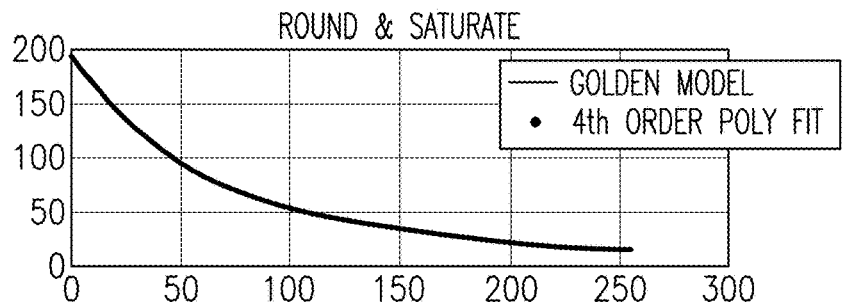
FIG. 6C is a graph of another example of an approximation function for resonator capacitor code versus center frequency code.

FIG. 6C is a graph of another example of an approximation function for resonator capacitor code versus center frequency code. The graph is similar to FIG. 6A, except both rounding and saturation were used at the output of the multiplier 431 in order to keep bit growth in check. In this example, the total number of bits for the fourth order polynomial approximation function was limited to 25.

As shown in FIGS. 6B and 6C, the polynomial approximation function closely tracks (overlaps) the golden model (look-up table) of resonator capacitor code versus center frequency code. Furthermore, the implementation with rounding and saturation provides similar root mean square (RMS) error relative to the implementation without rounding and saturation.

Figure 7:
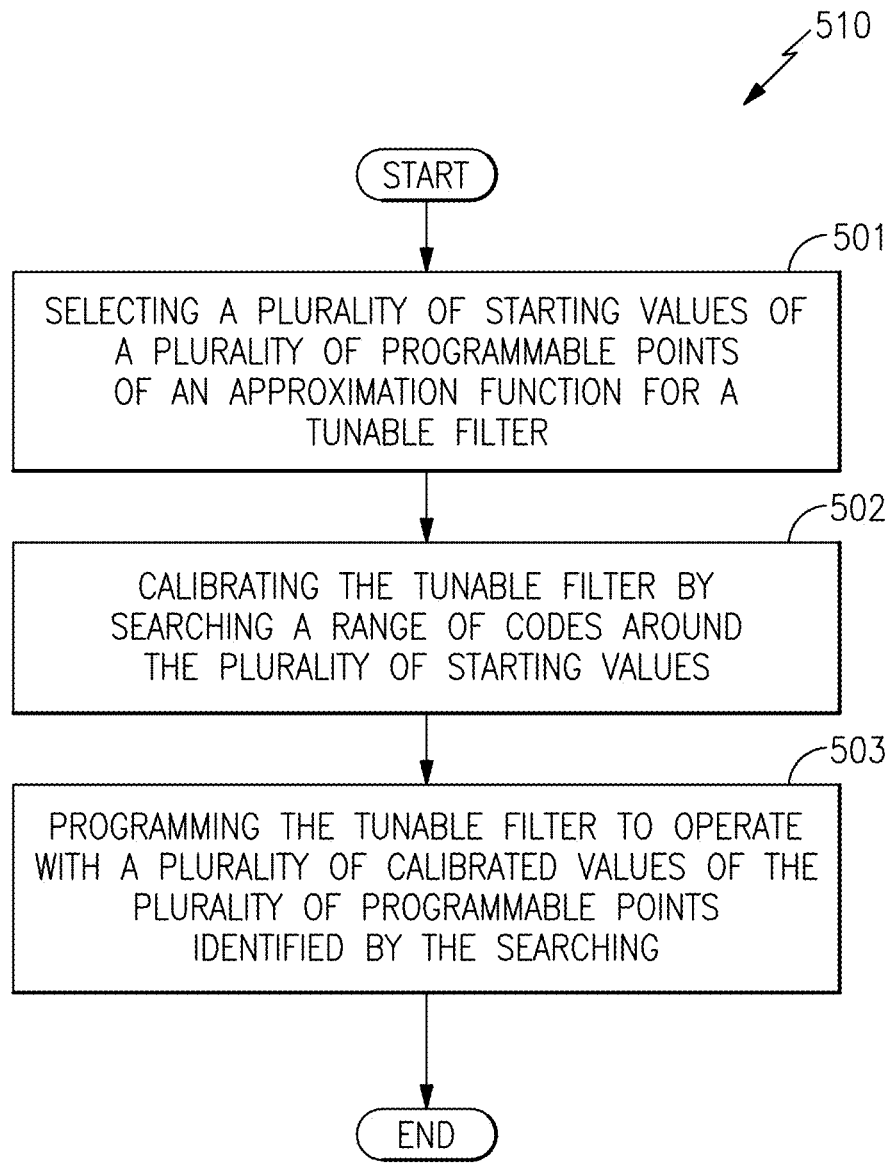
FIG. 7 is a flow diagram of a method of calibrating a tunable filter according to one embodiment.

FIG. 7 is a flow diagram of a method 510 of calibrating a tunable filter according to one embodiment. The method 510 can be performed by the tunable filter systems herein, for example, using the calibration circuit 33 of FIG. 3 in combination with the other components of the tunable filter system 50.

The method 510 begins at step 501, in which a plurality of starting values of a plurality of programmable points of an approximation function for a tunable filter are selected. The starting values can be obtained in a wide variety of ways, such as by simulation.

With continuing reference to FIG. 7, the method 510 continues to step 502, in which the tunable filter is calibrated by searching a range of codes around the plurality of starting values. In step 502, characteristics of the tunable filter (for instance, one or more frequency characteristics, such as center frequency) can be observed to determine whether the current values of the search perform better than any previous values. Thus, calibrated values of the programmable coefficients can be detected.

The number of search steps in the calibration can be relatively small. For instance, for the embodiment of FIGS. 4A-4C, the number of search steps can be less than $(L_1+L_2+L_3+3)*\Delta$, where $L_1$ is the number of subranges of $C_{RESO}$, $L_2$ is the number of subranges of $C_{BW}$, $L_3$ is the number of subranges of $C_{MATCH}$, and $\Delta$ is a programmable parameter representing the range over which the codes are searched from the initial starting values. In another implementation, separate programmable parameters $A_1$, $A_2$, and $A_3$ are used for $C_{RESO}$, $C_{BW}$, and $C_{MATCH}$, respectively, and the number of search steps can be less than $(L_1+1)*\Delta_1+(L_2+1)*\Delta_2+(L_3+1)*\Delta_3$.

The method 510 continues to a step 503, in which the tunable filter is programmed to operate with calibrated values of the plurality of programmable coefficients identified by the searching in step 502. The calibrated values can be stored in a memory, such as the memory 39 of FIG. 3.

FIG. 8A is a schematic diagram of a tunable filter 910 according to one embodiment. The tunable filter 910 includes series inductors 901A, 901B, . . . 901N and shunt capacitors 902A, 902B, . . . 902N electrically connected between an input terminal (IN) and an output terminal (OUT) as depicted. Any number of inductors and/or capacitors can be included and any combination of the components can be controllable.

A control circuit (not shown in FIG. 8A) can adjust the component values of controllable components to achieve tuning.

The tunable filter 910 of FIG. 8A illustrates yet another example of a tunable filter that can be controlled and calibrated in accordance with the teachings herein.

FIG. 8B is a schematic diagram of a tunable filter 920 according to another embodiment. The tunable filter 920 includes series capacitors 911A, 911B, . . . 911N and shunt inductors 912A, 912B, . . . 912N electrically connected between an input (IN) and an output (OUT) as depicted. Any number of inductors and/or capacitors can be included and any combination of the components can be controllable.

A control circuit (not shown in FIG. 8B) can adjust the component values of controllable components to achieve tuning.

In one embodiment, the tunable filter 920 of FIG. 8B is arranged in cascade with the tunable filter 910 of FIG. 8A (in either order or sequence) to provide a tunable bandpass filter.

The tunable filter 920 of FIG. 8B illustrates yet another example of a tunable filter that can be controlled and calibrated in accordance with the teachings herein.

Figure 9:
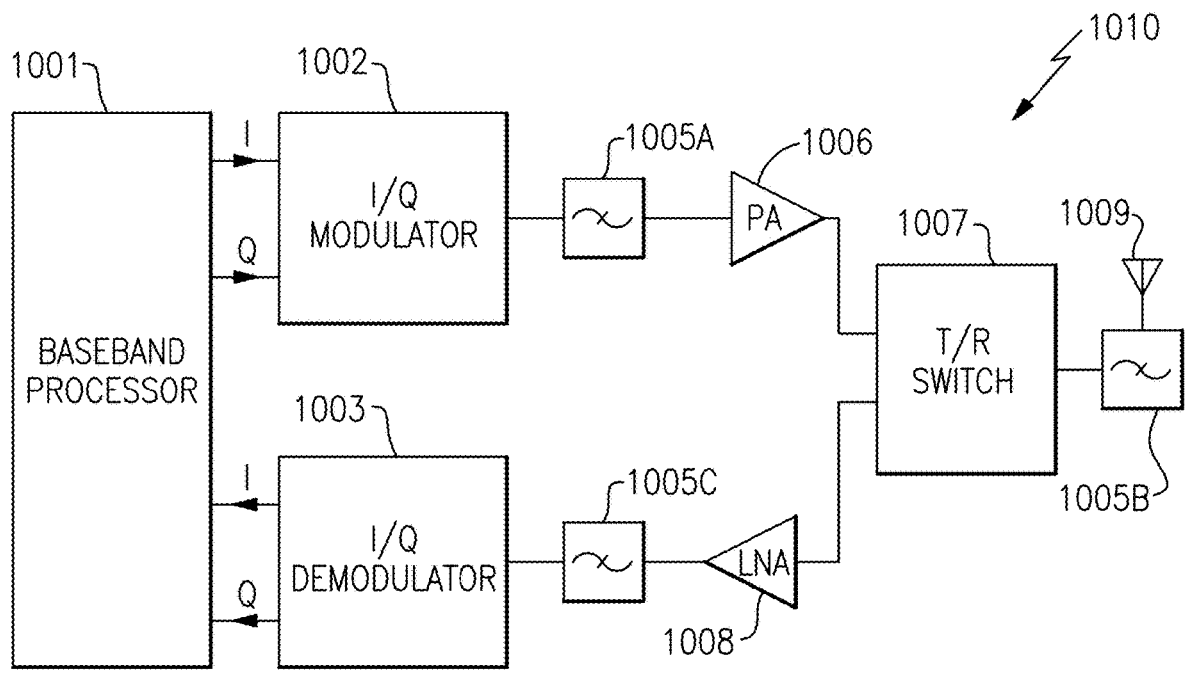
FIG. 9 is a schematic diagram of one example of an RF communication system that can include one or more tunable filters in accordance with the teachings herein.

FIG. 9 is a schematic diagram of one example of an RF communication system 1010 that can include one or more tunable filters in accordance with the teachings herein.

Although, the RF communication system 1010 illustrates one example of an electronic system that can include one or more tunable filters described herein, tunable filters can also be used in other configurations of electronic systems.

Furthermore, although a particular configuration of components is illustrated in FIG. 9, the RF communication system 1010 can be adapted and modified in a wide variety of ways. For example, the RF communication system 1010 can include more or fewer receive paths and/or transmit paths. Additionally, the RF communication system 1010 can be modified to include more or fewer components and/or a different arrangement of components, including, for example, a different arrangement of RF switching circuits, amplifiers, and/or filters.

In the illustrated configuration, the RF communication system 1010 includes a baseband processor 1001, an I/Q modulator 1002, an I/Q demodulator 1003, a first tunable filter 1005A, a power amplifier 1006, a transmit/receive (T/R) switch 1007, a low noise amplifier (LNA) 1008, an antenna 1009, a second tunable filter 1005B, and a third tunable filter 1005C. Although the first to third tunable filters 1005A-1005C are examples uses of tunable filters, other placements of tunable filter(s) in transmit and/or receive paths of the RF communication system 1010 are possible.

As shown in FIG. 9, baseband processor 1001 generates an in-phase (I) transmit signal and a quadrature-phase (Q) transmit signal, which are provided to the I/Q modulator 1002. Additionally, the baseband processor 1001 receives an I receive signal and a Q receive signal from the I/Q demodulator 1003. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1001 can include a digital signal processor, a microprocessor, or a combination thereof, used for processing the digital signals.

The I/Q modulator 1002 receives the I and Q transmit signals from the baseband processor 1001 and processes them to generate a modulated RF signal. In certain configurations, the I/Q modulator 1002 can include DACs configured to convert the I and Q transmit signals into an analog format, mixers for upconverting the I and Q transmit signals to radio frequency, and a signal combiner for combining the upconverted I and Q signals into the modulated RF signal.

The first tunable filter 1005A receives the modulated RF signal from the I/Q modulator 1002, and provides a filtered RF signal to an input of the power amplifier 1006. In certain configurations, the first tunable filter 1005A can implement a band pass filter configured to provide band filtering. In other implementations, the first tunable filter 1005A implements a low-pass filter, a band pass filter, a notch filter, a high-pass filter, or a combination thereof, based on the input control signal. Thus, the particular set of frequencies filtered by the first tunable filter 1005A can be adjusted using the input control signal applied to the first tunable filter 1005A.

The power amplifier 1006 can amplify the filtered RF signal to generate an amplified RF signal, which is provided to the transmit/receive switch 1007. The transmit/receive switch 1007 is further electrically connected to the second tunable filter 1005B and to an input of the low noise amplifier 1008. The second tunable filter 1005B is connected to the antenna 1009. Thus, in this example, the power amplifier 1006 provides the amplified RF signal to the antenna 1009 by way of the transmit/receive switch 1007 and the second tunable filter 1005B. However, other implementations are possible, such as configurations in which the second tunable filter 1005B is omitted.

In certain configurations, the second tunable filter 1005B can be configured to operate similarly to the first tunable filter 1005A, for example, by selectively implementing a band pass filter, a low-pass filter, a notch filter, a high-pass filter, or a combination thereof, based on an control input signal received at the second tunable filter 1005B. Thus, the particular set of frequencies filtered by the second tunable filter 1005B can be adjusted using the input control signal applied to the second tunable filter 1005B.

The transmit/receive switch 1007 can be used to selectively connect the antenna 1009 (via the second tunable filter 1005B) to the output of the power amplifier 1006 or to the input of the low noise amplifier 1008. In certain implementations, the transmit/receive switch 1007 can provide a number of other functionalities, including, but not limited to, band switching and/or switching between different power modes.

The LNA 1008 receives an antenna receive signal from the transmit/receive switch 1007, and generates an amplified antenna receive signal that is provided to the third tunable filter 1005C, which is configured to filter the receive signal and provide the filtered receive signal to the I/Q demodulator 1003.

In certain configurations, the third tunable filter 1005C can be configured to operate similarly to the first tunable filter 1005A, for example, by selectively implementing a band pass filter, a low-pass filter, a notch filter, a high-pass filter, or a combination thereof, based on an input signal received at the third tunable filter 1005C.

The I/Q demodulator 1003 can be used to generate the I receive signal and the Q receive signal, as was descried above. In certain configurations, the I/Q demodulator 1003 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

Figure 10:
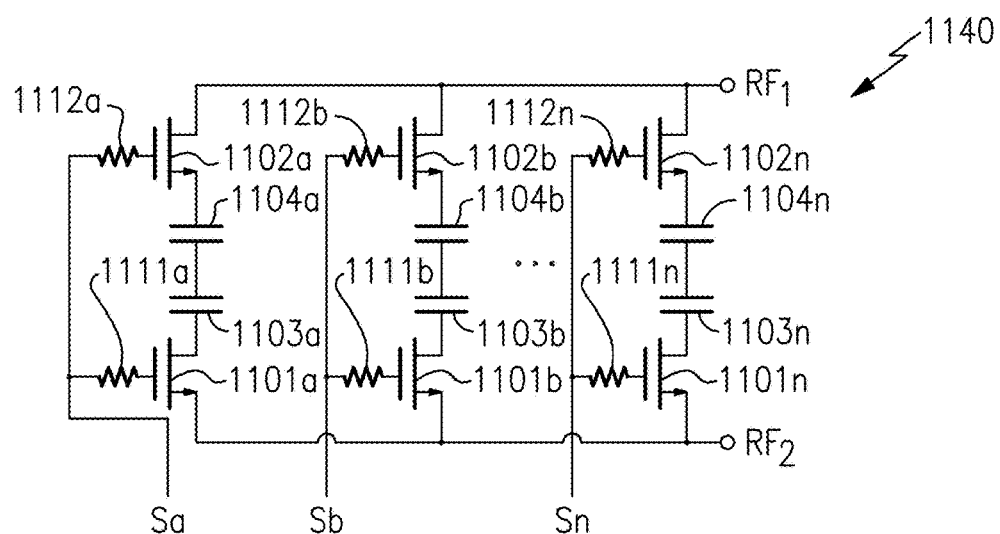
FIG. 10 is a schematic diagram of a controllable capacitor according to one embodiment.

FIG. 10 is a schematic diagram of a controllable capacitor 1140 according to one embodiment. The controllable capacitor 1140 includes a first group of field-effect transistors (FETs) $1101a$, $1101b$, . . . $1101n$, a second group of FETs $1102a$, $1102b$, . . . $1102n$, a first group of capacitors $1103a$, $1103b$, . . . $1103n$, a second group of capacitors $1104a$, $1104b$, . . . $1104n$, a first group of gate resistors $1111a$, $1111b$, . . . $1111n$, and a second group of gate resistors $1112a$, $1112b$, . . . $1112n$. The controllable capacitor 1140 is controlled by control bits Sa, Sb, . . . Sn representing a capacitor control code from a control circuit (now shown n FIG. 10).

The controllable capacitor 1140 illustrates one embodiment of a controllable capacitor that can be included in a tunable filter. However, the teachings herein are applicable to other implementations of controllable capacitors.

In the illustrated embodiment, the controllable circuit 1140 is implemented using multiple circuit branches in parallel between a first RF terminal $RF_1$ and a second RF terminal $RF_2$. Additionally, each circuit branch includes a series combination of a pair of FETs and a pair of capacitors, in this embodiment. For example, the leftmost branch of FIG. 10 includes the series combination of the FET $1101a$, the capacitor $1103a$, the capacitor $1104a$, and the FET $1102a$.

With continuing reference to FIG. 10, a control circuit (for example, the control circuit 2 of FIG. 1) selectively activates any desired number of branches based on the values of control bits Sa, Sb, . . . Sn, which can be generated using an approximation function in accordance with the teachings herein. By activating a desired number of branches, the amount of capacitance present between the first RF terminal $RF_1$ and the second RF terminal $RF_2$ is controlled.

Thus, the control bits Sa, Sb, . . . Sn select a particular branch by opening or closing the FETs in that branch. As shown in FIG. 10, the control bits are provided to each branch through gate resistors, which provide isolation. Although an example with two FETs per branch is shown, more or fewer FETs can be included to achieve a desired power handling capability. The FETs can be implemented in a wide variety of ways, including, but not limited to, metal-oxide-semiconductor FETs (MOSFETs), such as those fabricated using a silicon-on-insulator (SOI) process.

In the illustrated embodiment, each branch includes a pair of capacitors. By including multiple capacitors in series, enhanced linearity and/or smaller capacitive step size can be achieved relative to an implementation with a single capacitor in each branch. Although an example with two capacitors per branch is shown, more or fewer capacitors can be included. Moreover, although a particular order of components in the series is depicted, the order of the components can be changed or swapped. The capacitors can be implemented in a wide variety of ways including, but not limited to, metal-insulator-metal (MIM) capacitors.

The FETs and capacitors in each branch can have any desired size. In certain implementations, the capacitors in each branch are weighted according to a desired weighting scheme. By weighting the capacitors, wider capacitive tuning range can be achieved relative to an implementation with fixed weights for each branch. The transistor sizes can be weighted or unweighted, based on implementation.

Applications

Devices employing the above described schemes can be implemented into various electronic devices. Examples of electronic devices include, but are not limited to, RF communication systems, consumer electronic products, electronic test equipment, communication infrastructure, etc. For instance, tunable filters can be used in a wide range of RF communication systems, including, but not limited to, base stations, mobile devices, instrumentation, industrial electronics, military electronics, laptop computers, tablets, professional wideband digital radios, and compact and/or portable instruments. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A tunable filter system comprising:
   a tunable filter configured to receive a radio frequency (RF) signal and to output a filtered RF signal, the tunable filter including an inductor-capacitor (LC) resonator having a first controllable component, wherein a center frequency of the tunable filter changes based on a value of the first controllable component; and
   a control circuit configured to set the value of the first controllable component of the LC resonator based on an estimated value obtained from an approximation function of the center frequency.

2. The tunable filter system of claim 1, wherein the approximation function is a piece-wise linear function.

3. The tunable filter system of claim 2, wherein at least a portion of the approximation function has an input step size that is a power of two.

4. The tunable filter system of claim 1, wherein the approximation function is a polynomial function.

5. The tunable filter system of claim 1, wherein the tunable filter has a frequency characteristic that changes based on a value of a second controllable component, wherein the control circuit is further configured to set the value of the second controllable component based on the chosen value of the first controllable component.

6. The tunable filter system of claim 5, wherein the value of the second controllable component is chosen based on a piece-wise linear function in which the value of the first controllable component is an input.

7. The tunable filter system of claim 5, wherein the frequency characteristic is impedance matching.

8. The tunable filter system of claim 5, wherein the frequency characteristic is bandwidth.

9. The tunable filter system of claim 1, further comprising a calibration circuit configured to calibrate a plurality of points of the approximation function to account for variation.

10. The tunable filter system of claim 9, wherein calibration circuit is further configured to calibrate the plurality of points by searching a range of codes around a plurality of starting values of the plurality of coefficients.

11. The tunable filter system of claim 1, wherein the controllable component is a controllable capacitor.

12. The tunable filter system of claim 1, wherein the tunable filter is a bandpass filter.

13. A method of tunable filtering, the method comprising:
    filtering a radio frequency (RF) signal to generate a filtered RF signal using a tunable filter;
    controlling a center frequency of the tunable filter using a first controllable component of an inductor-capacitor (LC) resonator of the tunable filter;
    estimating a value of the first controllable component using an approximation function of the center frequency; and
    setting the first controllable component of the LC resonator to the estimated value using a control circuit.

14. The method of claim 13, wherein the approximation function is a piece-wise linear function.

15. The method of claim 14, wherein at least a portion of the approximation function has an input step size that is a power of two.

16. The method of claim 13, wherein the approximation function is a polynomial function.

17. The method of claim 13, further comprising setting a value of a second controllable component based on chosen value of the first controllable component.

18. The method of claim 17, further comprising obtaining the value of the second controllable component based on a piece-wise linear function in which the value of the first controllable component is an input.

19. The method of claim 13, further comprising calibrating a plurality of points of the approximation function to account for variation.

20. A tunable filter system comprising:
    a tunable filter configured to receive a radio frequency (RF) signal and to output a filtered RF signal, the tunable filter including an inductor-capacitor (LC) resonator having a first controllable component, wherein a center frequency of the tunable filter changes based on a value of the first controllable component; and a control circuit configured to set the value of the first controllable component of the LC resonator, wherein the control circuit comprises means for estimating the value of the first controllable component by an approximation function of the center frequency.

* * * * *